(12) United States Patent
He et al.

(10) Patent No.: US 10,134,952 B2
(45) Date of Patent: Nov. 20, 2018

(54) MANUFACTURING METHOD OF LIGHT EMITTING DEVICE

(71) Applicant: BOE TECHNOLOGY GROUP CO., LTD., Beijing (CN)

(72) Inventors: Xiaolong He, Beijing (CN); Shi Shu, Beijing (CN); Wei Xu, Beijing (CN); Zhanfeng Cao, Beijing (CN); Jikai Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/523,008

(22) PCT Filed: Oct. 11, 2016

(86) PCT No.: PCT/CN2016/101788
§ 371 (c)(1),
(2) Date: Apr. 28, 2017

(87) PCT Pub. No.: WO2017/118131
PCT Pub. Date: Jul. 13, 2017

(65) Prior Publication Data
US 2018/0062034 A1    Mar. 1, 2018

(30) Foreign Application Priority Data

Jan. 8, 2016    (CN) .......................... 2016 1 0012381

(51) Int. Cl.
| | | |
|---|---|---|
| *H01L 33/00* | (2010.01) | |
| *H01L 33/14* | (2010.01) | |
| *H01L 51/50* | (2006.01) | |
| *H01L 51/56* | (2006.01) | |
| *H01L 33/06* | (2010.01) | |
| *H01L 33/36* | (2010.01) | |

(52) U.S. Cl.
CPC ............ *H01L 33/14* (2013.01); *H01L 33/005* (2013.01); *H01L 33/06* (2013.01); *H01L 33/36* (2013.01); *H01L 51/50* (2013.01); *H01L 51/56* (2013.01); *H05K 999/99* (2013.01)

(58) Field of Classification Search
CPC ....... H01L 33/14; H01L 33/005; H01L 33/06; H01L 33/36; H01L 51/50; H01L 51/56; H01L 55/5253; H05K 999/99
See application file for complete search history.

(56) References Cited

U.S. PATENT DOCUMENTS 8,993,995 B2 *   3/2015  Miyata ................... B82Y 20/00
                                                              257/13
9,054,330 B2     6/2015  Qian et al.
(Continued)

FOREIGN PATENT DOCUMENTS

CN    101097990 A    1/2008
CN    102280546 A    12/2011
(Continued)

OTHER PUBLICATIONS

International Search Report dated Dec. 29, 2016 in corresponding International Application No. PCT/CN2016/101788 along with an English translation of the International Search Report and an English translation of the Written Opinion of the International Searching Authority.
(Continued)

*Primary Examiner* — Nikolay Yushin
(74) *Attorney, Agent, or Firm* — Nath, Goldberg & Meyer; Joshua B. Goldberg (57) ABSTRACT

The invention relates to a light emitting device, a manufacturing method thereof and a display device. The light emitting device comprises: a substrate, and a first electrode layer, a second electrode layer and a light emitting layer arranged above the substrate, the light emitting layer being disposed between the first electrode layer and the second electrode layer, the light emitting layer comprises a hole
(Continued)

transport layer having a first thickness which is capable of avoiding performance degradation of the light emitting device.

8 Claims, 7 Drawing Sheets

(56) References Cited

U.S. PATENT DOCUMENTS

2009/0221209 A1    9/2009  Ha et al.
2013/0069036 A1*   3/2013  Miyata ................... B82Y 20/00
                                                            257/13
2017/0092701 A1*   3/2017  Uchida ............... H01L 27/3225

FOREIGN PATENT DOCUMENTS

| CN | 102473800 A | 5/2012 |
| CN | 103247731 A | 8/2013 |
| CN | 103346221 A | 10/2013 |
| CN | 104701430 A | 6/2015 |
| CN | 105489781 A | 4/2016 |

OTHER PUBLICATIONS

First Office Action dated Dec. 20, 2016 in corresponding Chinese Patent Application No. 201610012381.4.
Second Office Action dated May 26, 2017 in corresponding Chinese Patent Application No. 201610012381.4.

* cited by examiner

MANUFACTURING METHOD OF LIGHT EMITTING DEVICE

This is a National Phase Application filed under 35 U.S.C. 371 as a national stage of PCT/CN2016/101788, filed Oct. 11, 2016, an application claiming the benefit of Chinese Application No. 201610012381.4, filed Jan. 8, 2016, the content of each of which is hereby incorporated by reference in its entirety.

TECHNICAL FIELD

The invention relates to the technical field of display, in particular to a light emitting device, a manufacturing method thereof and a display device.

BACKGROUND

Quantum Dot electroluminescent devices have the advantages of high color gamut, bright color, sharp contrast, and being suitable for fabricating large size devices, and are therefore developed by companies and research institutions widely. In particular, quantum dot electroluminescent devices formed through solution process attracts wide attention recently for a large potential in industrial application. Typical structure of existing quantum dot electroluminescent device comprises an anode, a hole injection transport layer, a quantum dot light emitting layer, an electron injection transport layer and a cathode provided sequentially, wherein the hole injection transport layer, the quantum dot light emitting layer, and the electron injection transport layer form a light emitting layer. In practical applications, the electron injection transport layer may be configured as two layers including an electron transport layer and an electron injection layer, and the hole injection transport layer may also be configured as two layer including a hole transport layer and a hole injection layer.

An optimal material for ETL (electron transport layer) in the quantum dot electroluminescent device is ZnO (Zinc Oxide) nanoparticle, and an optimal material for HTL (hole transport layer) is TFB, poly (9,9-two octyl fluorene-co-N-(4-butyl phenyl) two aniline)). In solution process of the quantum dot electroluminescent device with largest potential in industrial application, solvent such as toluene, chloroform and so on containing the quantum dot materials is generally subjected to a deposition process to form a film layer; other film layers may also be obtained by solution deposition or spin coating followed by thermal evaporation. However, the solvent for current spin coating may cause damage to existing film layers, e.g. the deposited TFB will be dissolved by the quantum dot solvent (toluene), causing HTL damage, thereby the hole transport layer cannot reach a desired structure size, resulting in performance degradation of light emitting devices.

SUMMARY

The invention provides a light emitting device and a manufacturing method thereof and a display device for preventing performance degradation of the light emitting device.

In order to achieve the above purpose, the present disclosure provides a light emitting device comprising: a substrate, and a first electrode layer, a second electrode layer and a light emitting layer arranged above the substrate, the light emitting layer being disposed between the first electrode layer and the second electrode layer; the light emitting layer comprises a hole transport layer having a first thickness which is capable of avoiding performance degradation of the light emitting device.

Optionally, the first thickness ranges from 6 nm to 10 nm.

Optionally, the first thickness is 6.4 nm.

Optionally, the light emitting layer further comprises a quantum dot layer disposed on the hole transport layer.

Optionally, the light emitting layer further comprises an electron injection transport layer disposed on the quantum dot layer.

In order to achieve the above purpose, the present disclosure provides a display device comprising the above light emitting device.

In order to achieve the above purpose, the present disclosure provides a manufacturing method of the light emitting device, comprising steps of:

forming a first electrode layer on a substrate;

forming a light emitting layer on the first electrode layer, the light emitting layer comprising a hole transport layer having a first thickness capable of avoiding performance degradation of the light emitting device;

forming a second electrode layer on the light emitting layer.

Optionally, the light emitting layer further comprises a quantum dot layer, the step of forming a light emitting layer on the first electrode layer comprises:

coating a hole transport material layer on the first electrode layer through spin coating process;

drying the hole transport material layer to form an initial hole transport layer having an initial thickness;

forming a quantum dot material layer on the initial hole transport layer through spin coating process, wherein the initial hole transport layer is damaged by solvent of the quantum dot material layer so as to form the hole transport layer having the first thickness.

Optionally, the initial thickness ranges from 20 nm to 30 nm.

Optionally, the initial thickness is 24 nm.

Optionally, the first thickness ranges from 6 nm to 10 nm.

Optionally, the spin coating speed of the spin coating process is 2000 rpm, and the spin coating period of the spin coating process is 30 s.

Optionally, the step of drying the hole transport material layer comprises:

in a nitrogen atmosphere, performing a drying process at a temperature of 180° C. on the hole transport material layer for 30 min.

Optionally, the step of forming a light emitting layer further comprises forming an electron injection transport layer through spin coating process after the hole transport layer is formed.

The solution of the present disclosure has the following advantageous effects:

according to the light emitting device, the manufacturing method thereof and the display device of the present disclosure, the first electrode layer, the second electrode layer and the light emitting layer are formed on the substrate, the light emitting layer is provided between the first electrode layer and the second electrode layer, the light emitting layer comprises a hole transport layer having a first thickness, which avoids performance degradation of the light emitting device.

DETAILED DESCRIPTION

In order to provide a better understanding of the technical solutions of the present disclosure to those skilled in the art, the light emitting device, the manufacturing method thereof and the display device provided by the present disclosure are described in further detail below in conjunction with the drawings.

Figure 1:
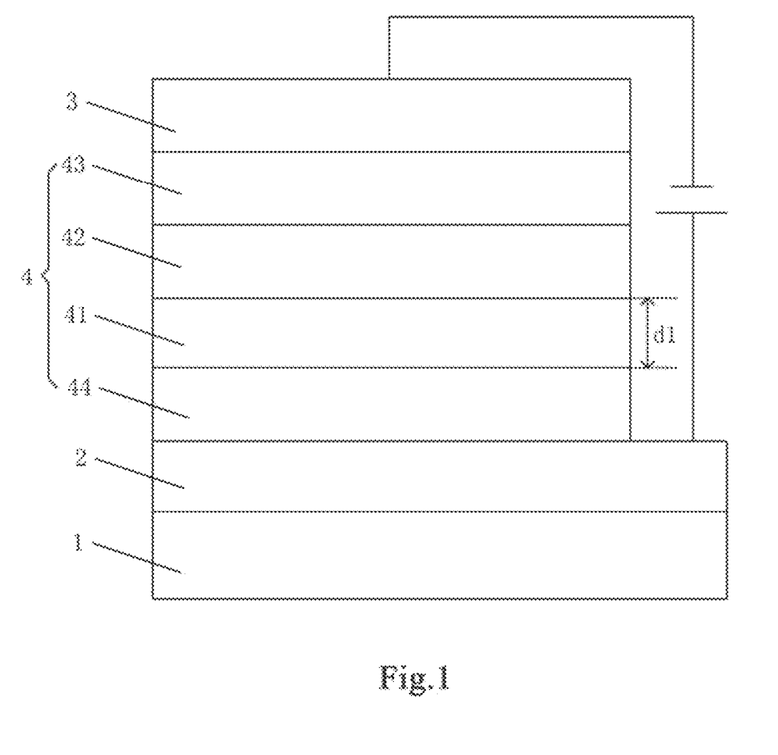
FIG. 1 is a schematic structural view of a light emitting device according to a first embodiment of the disclosure.

FIG. 1 is a schematic structural view of a light emitting device according to the first embodiment of the present disclosure, as shown in FIG. 1, the light emitting device comprises: a substrate 1, and a first electrode layer 2, a second electrode layer 3 and a light emitting layer 4 arranged above the substrate 1, the light emitting layer 4 being disposed between the first electrode layer 2 and the second electrode layer 3; the light emitting layer 4 comprises a hole transport layer 41 having a first thickness d1 which is capable of avoiding performance degradation of the light emitting device.

In the present embodiment, the first electrode layer 2 is an anode and the second electrode layer 3 is a cathode.

In the present embodiment, the first thickness d1 is in the range of 6 nm to 10 nm. Optionally, the first thickness d1 is 6.4 nm.

Figure 2:
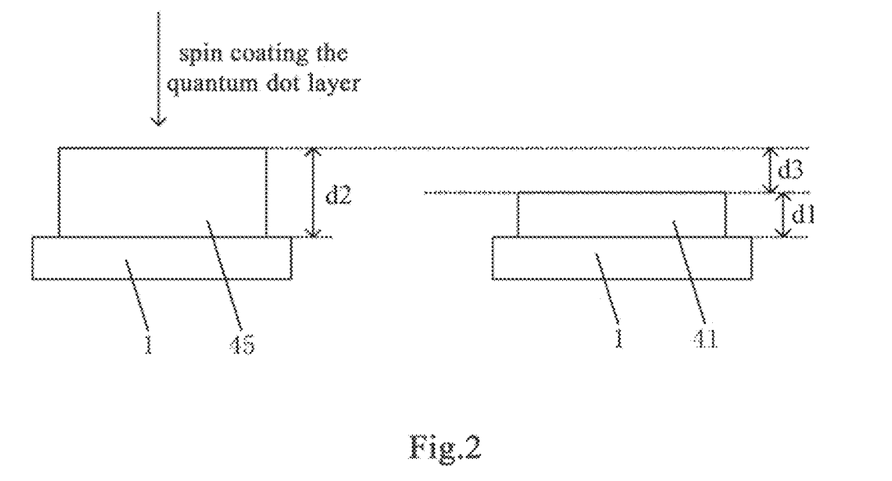
FIG. 2 is a schematic view showing a destruction test to the hole transport layer in FIG. 1.

The light emitting layer 4 further comprises a quantum dot layer 42 disposed above the hole transport layer 41. In order to ensure that the hole transport layer 41 is provided with the first thickness d1, a destruction test to the hole transport layer 41 may be performed before actual production. FIG. 2 is a schematic view showing the destruction test to the hole transport layer of FIG. 1. As shown in FIG. 2, a hole transport material layer is spin coated on the substrate 1, and then the hole transport material layer is dried to form an initial hole transport layer 45 having an initial thickness d2; a quantum dot material layer is spin coated on the initial hole transport layer 45, during coating of the quantum dot material layer, the toluene solvent will cause damage to the initial hole transport layer 45, resulting a thickness loss d3 for the initial hole transport layer 45, the remaining part of the initial hole transport layer 45 after subtracting the thickness loss d3 forms the hole transport layer 41 having the first thickness d1. That is, the quantum dot material layer causes damage to the initial hole transport layer 45 for forming the hole transport layer 41, so as to obtain the hole transport layer 41 having the first thickness d1.

Furthermore, the light emitting layer 4 further comprises an electron injection transport layer 43 and a hole injection layer 44. The electron injection transport layer 43 is disposed between the quantum dot layer 42 and the second electrode 3; specifically, the electron injection transport layer 43 is provided on the quantum dot layer 42, the second electrode 3 is provided on the electron injection transport layer 43. The hole injection layer 44 is disposed between the first electrode 2 and the hole transport layer 41; specifically, the hole injection layer 44 is provided on the first electrode 2, the hole transport layer 41 is provided on the hole injection layer 44. In practical applications, the electron injection transport layer may be configured as two layers, i.e. an electron transport layer and an electron injection layer, which will not be described in detail.

In the present embodiment, during the destruction test of the hole transport layer 41, parameters of the light emitting device may be tested by controlling the thickness of the hole transport layer. The specific test results are as follows.

Figure 3:
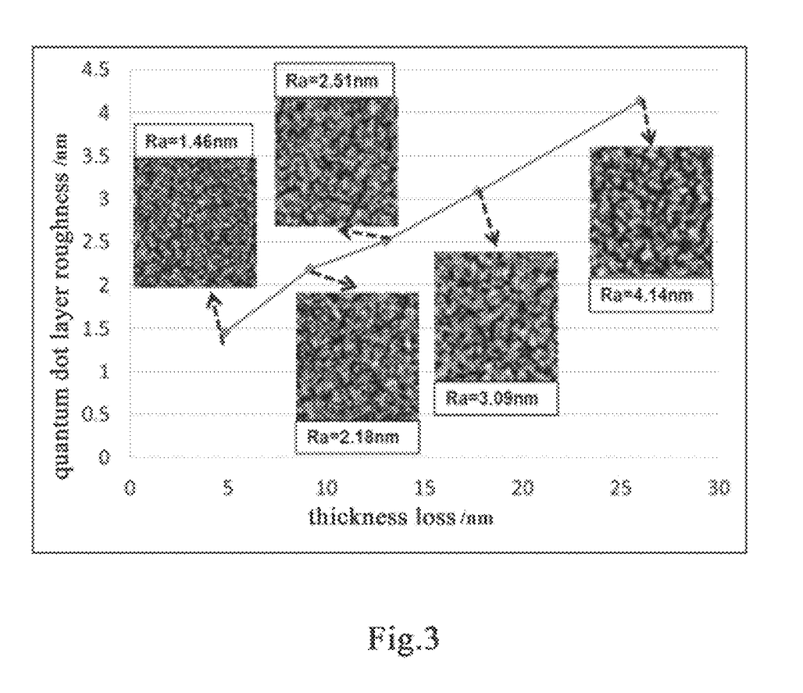
FIG. 3 shows a corresponding relationship diagram of a quantum dot layer roughness and a thickness loss of the hole transport layer in the first embodiment.

1. The thickness loss d3 is reduced by controlling the initial thickness of the initial hole transport layer 45, so that the quantum dot layer roughness (Ra) can be significantly reduced. It is determined according to result of the AFM test of the quantum dot layer 42 that the quantum dots exhibit significant agglomeration when the thickness loss d3 is large (for example larger than 20 nm), and the agglomeration of the quantum dots is reduced as the thickness loss decreases. FIG. 3 shows a corresponding relation diagram of a quantum dot layer roughness and a thickness loss of the hole transport layer in the first embodiment. As shown in FIG. 3, when the thickness loss d3 is 26 nm, Ra is 4.14 nm; when the thickness loss d3 is 18 nm, Ra is 3.08 nm; when the thickness loss d3 is 13 nm, Ra is 2.51 nm; when the thickness loss d3 is 8 nm, Ra is 2.18 nm; when the thickness loss d3 is 5 nm, Ra is 1.46 nm. As can be seen from FIG. 3, the smaller the thickness loss, the smaller the quantum dot layer roughness, especially when the thickness loss d3 is 5 nm, the quantum dots are substantially uniformly dispersed.

Figure 4:
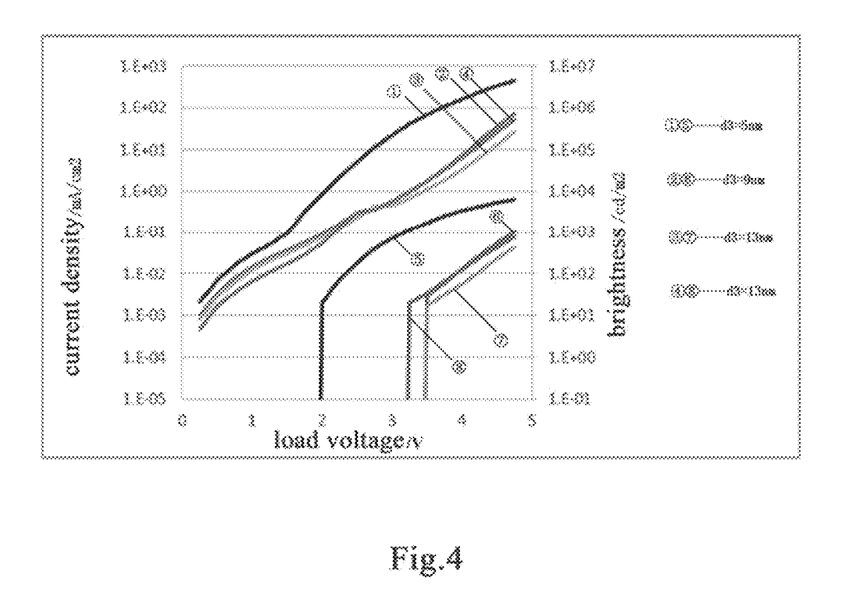
FIG. 4 shows a corresponding relationship diagram of a current density and brightness versus a load voltage in the first embodiment.

2. The quantum dot layer roughness can be reduced by reducing the thickness loss d3, thereby enhancing charge injection capacity of the light emitting device, and reducing an enabling voltage of the light emitting device. The resistance of the light emitting device is mainly provided by the quantum dot layer 42, and the thickness of the hole transport layer 41 affects the balance of the carriers but has little effect on the current density of the light emitting device. Therefore, the improvement of the charge injection capacity is mainly resulted from a decrease of Ra due to improvement in quality of film layer of the quantum dot layer 42. FIG. 4 is a corresponding relation diagram of a current density and brightness versus a load voltage in the first embodiment. FIG. 4 shows two groups of curves, one for the corresponding curves of the current density and the load voltage, and the other for the brightness and the load voltage. As shown in FIG. 4, curves ①, ②, ③, ④ are the corresponding curves of the current density and the load voltage, curves ⑤, ⑥, ⑦, ⑧ are the corresponding curves of the brightness and the load voltage, curves ① and ⑤ show the case when the thickness loss d3=5 nm, curves ② and ⑥ show the case when the thickness loss d3=9 nm, curves ③ and ⑦ show the case when the thickness loss d3=13 nm, curves ④ and ⑧ show the case when the thickness loss d3=13 nm. As can be seen from FIG. 4, when the thickness loss d3 of the hole transport layer 41 is different, the difference in the current density is not so large, so the thickness loss d3 of the hole transport layer 41 has little effect on the current density. It can be seen from FIG. 4 that for the curves ⑤, ⑥, ⑦, ⑧, the minimum value of the load voltage corresponding to the brightness (i.e. the inflection point of the curve in the drawing) is the enabling voltage of the light emitting device, for example curve ⑤ corresponds to an enabling voltage of 2V, curves ⑥ and ⑦ correspond to an enabling voltage of 3.2V, curve ⑧ corresponds to an enabling voltage of 3.5V. That is, the smaller the thickness loss d3, the lower the enabling voltage of the light emitting device.

Figure 5:
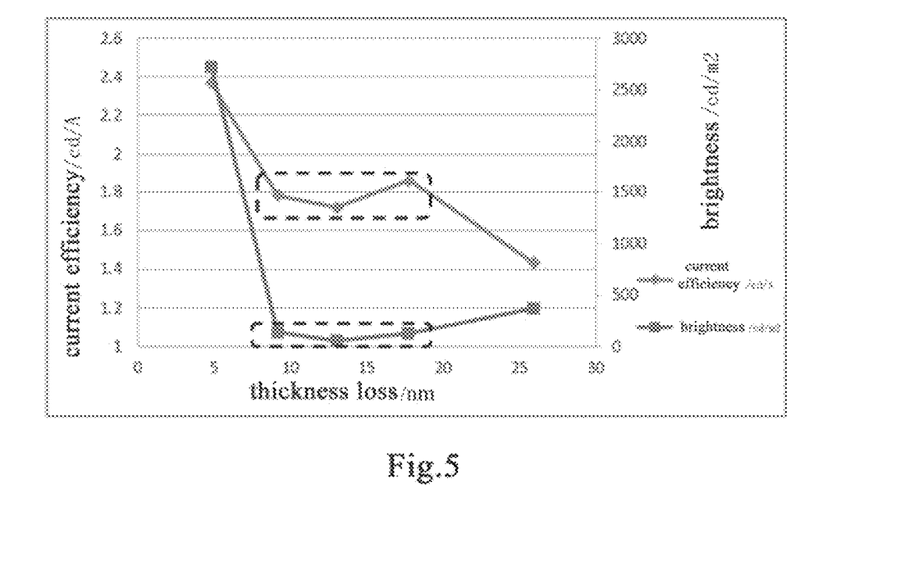
FIG. 5 shows a corresponding relationship diagram of a current efficiency and brightness versus the thickness loss in the first embodiment.

3. The current efficiency and brightness of the light emitting device can be improved by reducing the thickness loss d3. FIG. 5 is a corresponding relationship diagram of a current efficiency and brightness versus the thickness loss in the first embodiment. FIG. 5 shows two curves, one is a corresponding curve for current efficiency and thickness loss, the other is a corresponding curve for brightness and thickness loss. As shown in FIG. 5, when the thickness loss d3 is in the range of 10 nm to 20 nm, the current efficiency and the brightness have little change; when the thickness loss d3 is larger than 20 nm, the current efficiency declines continuously; and when the thickness loss d3 is reduced to 5 nm, the current efficiency and the brightness are both increased significantly. In conclusion, when the thickness loss is reduced, the quantum dots of the quantum dot layer are distributed evenly and the layer is flat, which provides a better place for luminescence by recombination of electrons and holes, thus improving the current efficiency and the brightness of the light emitting device. It should be noted that, as shown in FIG. 5, it is necessary to test the brightness of the light emitting device, so all the light emitting devices to be measured are to be lit, which requires a load voltage used in the test larger than the enabling voltage of all the light emitting devices. The load voltage used in FIG. 5 is 4V.

Figure 6:
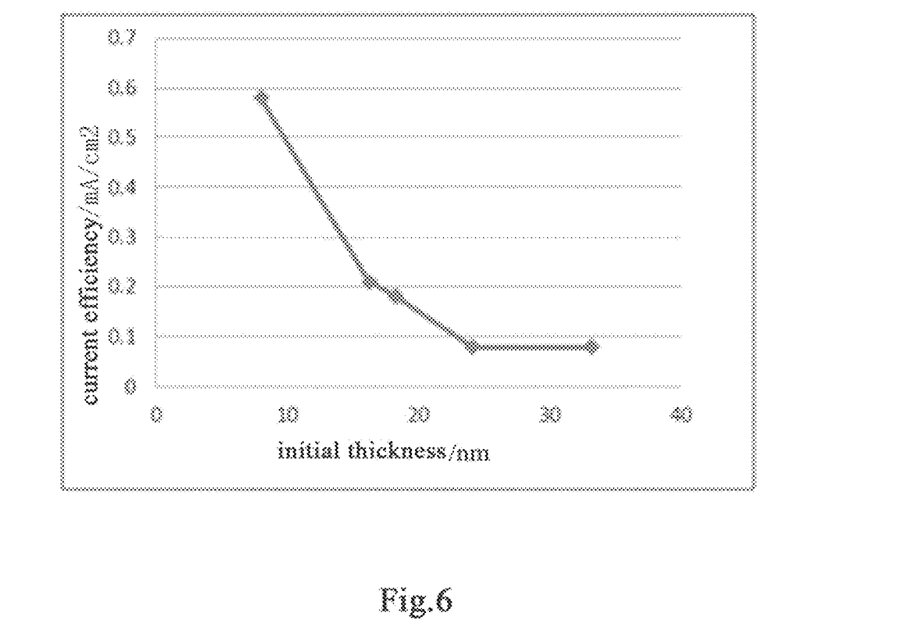
FIG. 6 shows a corresponding relationship diagram of a leakage current in the light emitting device versus the initial thickness of the initial hole transport layer.
Figure 7:
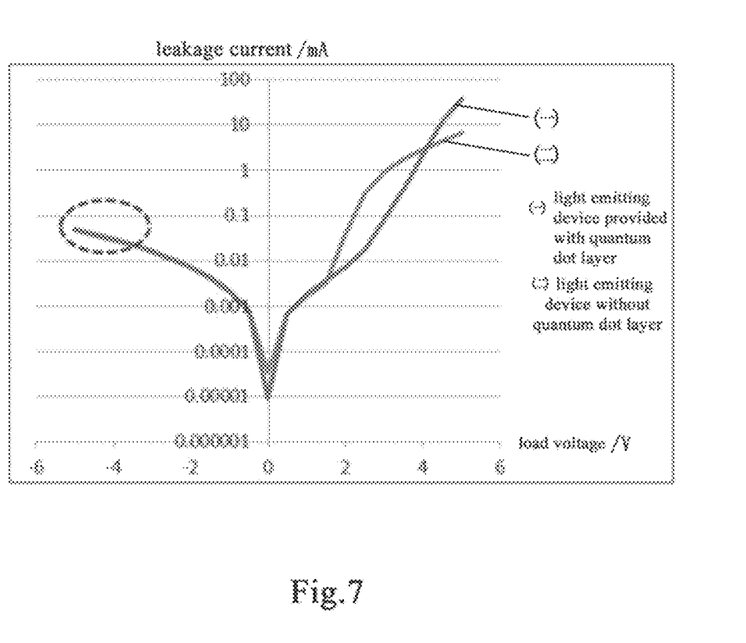
FIG. 7 shows a comparison diagram of the leakage currents in the light emitting device of the first embodiment and in a light emitting device without the quantum dot layer.

4. The leakage current of the light emitting device can be reduced by increasing the initial thickness d2 of the initial hole transport layer 45. FIG. 6 is a corresponding relationship diagram between a leakage current of the light emitting device and an initial thickness of the initial hole transport layer in the first embodiment. As shown in FIG. 6, as the initial thickness d2 of the initial hole transport layer 45 increases, the leakage current gradually decreases; when the initial thickness d2 is larger than 24 nm (in this case the thickness loss d3 is larger than 6.4 nm), the leakage current stops decreasing. FIG. 7 is an I-V comparison diagram between a light emitting device provided with a quantum dot layer in the first embodiment and a light emitting device without the quantum dot layer. As shown in FIG. 7, curve (i) is the I-V curve of the light emitting device in which the quantum dot layer is provided, curve (ii) is the I-V curve of the light emitting device without the quantum dot layer. In an interval where the load voltage ranges from −5V to 0V, the curves (i) and (ii) are almost completely coincident with each other, and the curves (i) and (ii) are very close in an interval where the load voltage ranges from 0V to 5V. Therefore, compared with the light emitting device without the quantum dot layer, the leakage current of the light emitting device provided with the quantum dot layer is at a normal level, especially when the load voltage is −5 V (i.e., the position denoted by the dashed circle in the figure). FIG. 7 shows an I-V curve of the light emitting device when the initial thickness d2 is 24 nm.

According to the results of above four tests, it can be determined that as the initial thickness d2 of the initial hole transport layer 45 gradually increases, the leakage current of the light emitting device decreases, the stability of the light emitting device increases, and the life of the light emitting device increases remarkably. Table 1 shows the corresponding relationship between the initial thickness of the initial hole transport layer and the lifetime of the light emitting device, as shown in Table 1 below:

TABLE 1

| | Initial thickness | | | | |
|---|---|---|---|---|---|
| | 8 nm | 16 nm | 18 nm | 24 nm | 33 nm |
| T95 | 21 h | 46 h | 48 h | >100 h | >100 h |

As shown in Table 1, when the initial thickness d2 of the initial hole transport layer 45 is larger than 24 nm and the thickness loss d3 is larger than 6.4 nm, T95>100 h. T95 is the time during which the luminance of the light emitting device is attenuated to 95% of the initial luminance, hence is the lifetime of the light emitting device. During the test a constant load current of 10 mA/cm2 can be used to drive the light emitting device to emit light.

Figure 8:
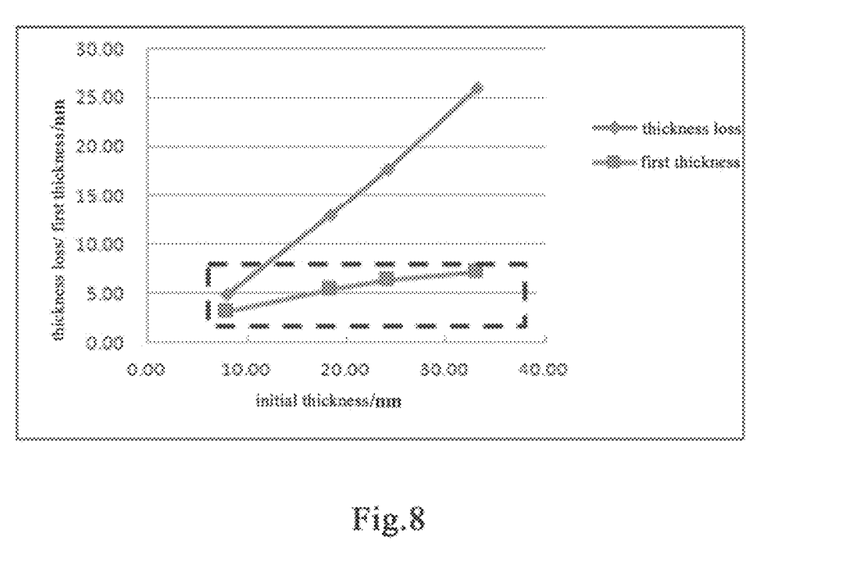
FIG. 8 shows a corresponding relationship diagram of the thickness loss and the first thickness versus the initial thickness in the first embodiment.

It is necessary to take into account the current efficiency and the lifetime of the light emitting device for determining a suitable initial thickness d2 for the light emitting device. FIG. 8 is a corresponding relationship diagram of the thickness loss and the first thickness versus the initial thickness in the first embodiment. Two curves are shown in FIG. 8, one is a corresponding curve for the thickness loss d3 and the initial thickness d2, and the other is a corresponding curve for the first thickness d1 and the initial thickness d2 (the curve in the dashed box in the figure). As shown in FIG. 8, both the thickness loss d3 and the first thickness d1 increase as the initial thickness d2 increases. The smaller the initial thickness d2, the smaller the thickness loss d3 and the first thickness d1. On the other hand, the larger the initial thickness d2, the larger the thickness loss d3 and the first thickness d1. According to the above test results, it can be seen that the smaller the thickness loss d3, the larger the current efficiency of the light emitting device, and the larger the initial thickness d2, the longer the lifetime of the light emitting device. In order to make the light emitting device have both a high current efficiency and a long lifetime, the initial thickness d2 of the initial hole transport layer 45 is optimal to be 24 nm, and the spin coating speed for the corresponding initial hole transport layer 45 is 2000 rpm and the spin coating period is 30 s when the initial thickness d2 of the initial hole transport layer 45 is 24 nm. The initial thickness d2 is optimized to provide a light emitting device having a high current efficiency and a long lifetime, ensuring that the light emitting device has good performance, thereby avoiding degradation of the performance of the light emitting device.

It should be noted that in FIG. 1 of the present embodiment, the lateral length of each layer structure is only one example rather than an actual length of the structure, and the technical solution of the present disclosure is not limited thereto.

In the light emitting device provided by the present embodiment, a first electrode layer, a second electrode layer and a light emitting layer are formed on the substrate, the light emitting layer is disposed between the first electrode layer and the second electrode layer, and the light emitting layer includes a hole transport layer having a first thickness, thereby avoiding degradation of the performance of the light emitting device.

A second embodiment of the present disclosure provides a display device comprising a light emitting device. The light emitting device may be the light emitting device provided in the first embodiment, the details of which are omitted here.

Optionally, the light emitting device is a quantum dot electroluminescent device.

In the solution of the display device provided by the present embodiment, a first electrode layer, a second electrode layer and a light emitting layer are formed on a substrate, the light emitting layer is disposed between the first electrode layer and the second electrode layer, and the light emitting layer includes a hole transport layer having a first thickness, thereby avoiding degradation of the performance of the light emitting device.

Figure 9:
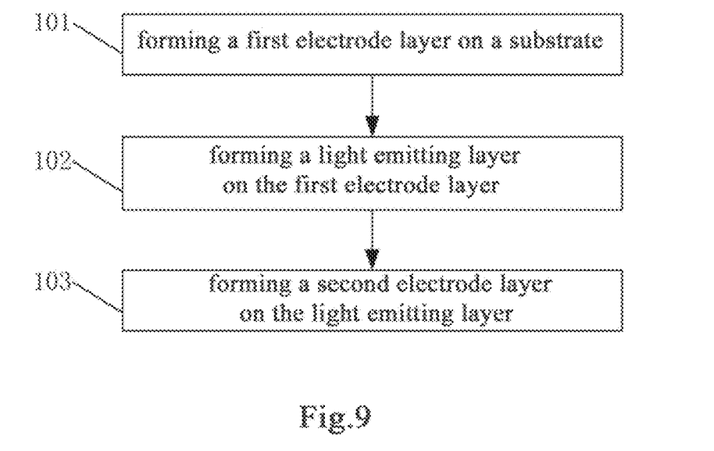
FIG. 9 shows a flow chart of a manufacturing method of the light emitting device according to a third embodiment.

FIG. 9 is a flow chart of a manufacturing method of the light emitting device according to a third embodiment of the present disclosure. As shown in FIG. 9, the manufacturing method comprises:

step 101, forming a first electrode layer on a substrate;

step 102, forming a light emitting layer on the first electrode layer, the light emitting layer comprising a hole transport layer having a first thickness capable of avoiding performance degradation of the light emitting device;

step 103, forming a second electrode layer on the light emitting layer.

The manufacturing method provided in the present embodiment can be used for fabricating the light emitting device in the first embodiment. A detailed description to the light emitting device is provided in the above-mentioned first embodiment.

In the solution of the manufacturing method of the light emitting device according to the present embodiment, a first electrode layer, a second electrode layer and a light emitting layer are formed on the substrate, the light emitting layer is disposed between the first electrode layer and the second electrode layer, and the light emitting layer includes a hole transport layer having a first thickness, thereby avoiding degradation of the performance of the light emitting device.

Figure 10:
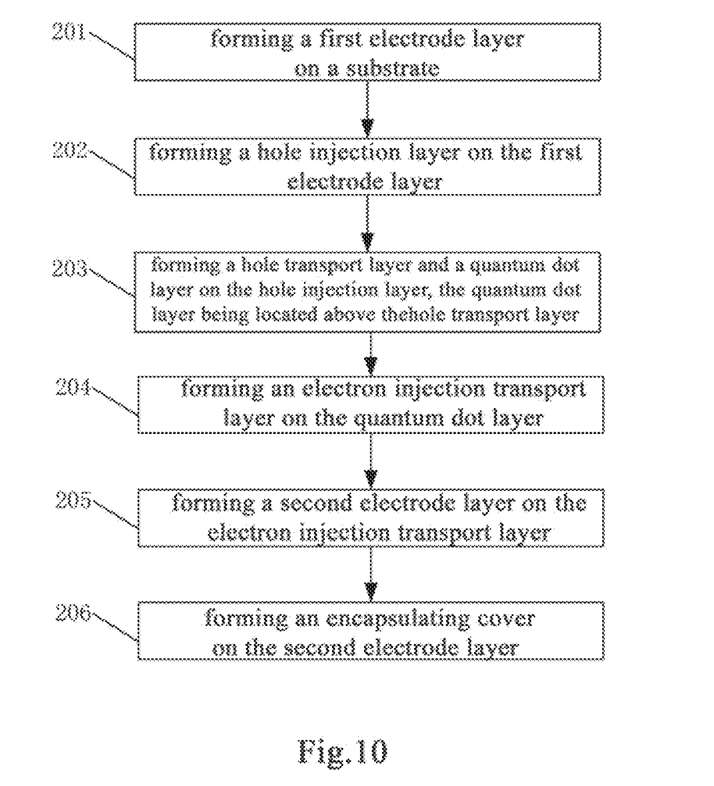
FIG. 10 shows a flow chart of a manufacturing method of the light emitting device according to a fourth embodiment.

Hereinafter the manufacturing method of the third embodiment will be described in detail taking a specific embodiment as example. FIG. 10 is a flow chart of a manufacturing method of the light emitting device according to a fourth embodiment; as shown in FIG. 10, the manufacturing method comprises:

Step 201, forming a first electrode layer on a substrate.

Figure 11A:
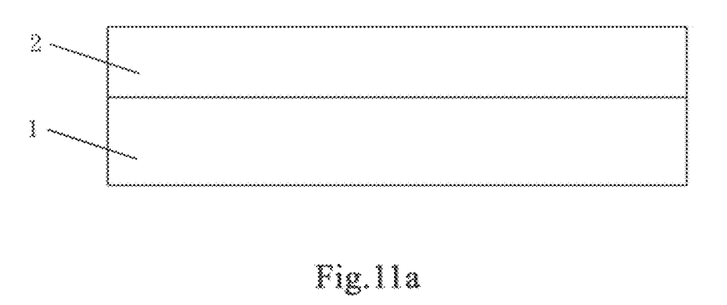
FIG. 11a is a schematic view showing formation of the first electrode layer in the fourth embodiment.

FIG. 11a is a schematic view showing formation of the first electrode layer in the fourth embodiment. As shown in FIG. 11a, a first electrode material layer is formed on the substrate 1 by a sputtering process, and a patterning process is performed on the first electrode material layer to form a first electrode layer 2. The material for the second electrode layer 2 may be ITO.

Step 202, forming a hole injection layer on the first electrode layer.

Figure 11B:
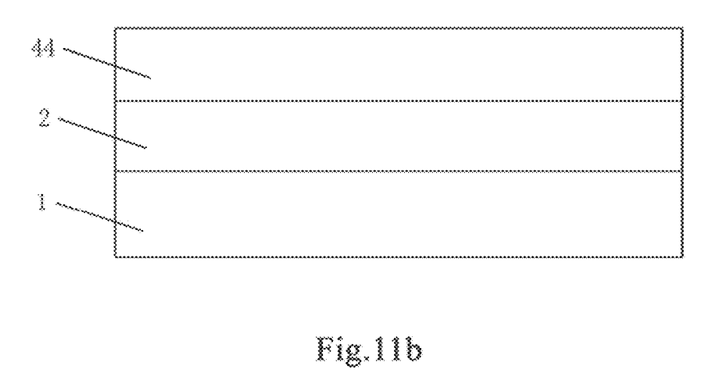
FIG. 11b is a schematic view showing formation of the hole injection layer in the fourth embodiment.

FIG. 11b is a schematic view showing formation of the hole injection layer in the fourth embodiment. As shown in FIG. 11b, a hole injection material layer is spin-coated on the first electrode layer 2, and the hole injection material layer is subjected to a drying processing to form a hole injection layer 44. Specifically, the hole injection material layer can be dried at 150° C. in an air atmosphere for 15 min. The material of the hole injection layer 44 is PEDOT-PSS, wherein PEDOT is an abbreviation for poly (3,4-ethylene-dioxythiophene), PSS is an abbreviation for Poly (sodium-p-styrenesulfonate).

Step 203, forming a hole transport layer and a quantum dot layer on the hole injection layer, the quantum dot layer being located above the hole transport layer, and the hole transport layer having a first thickness.

Figure 11C:
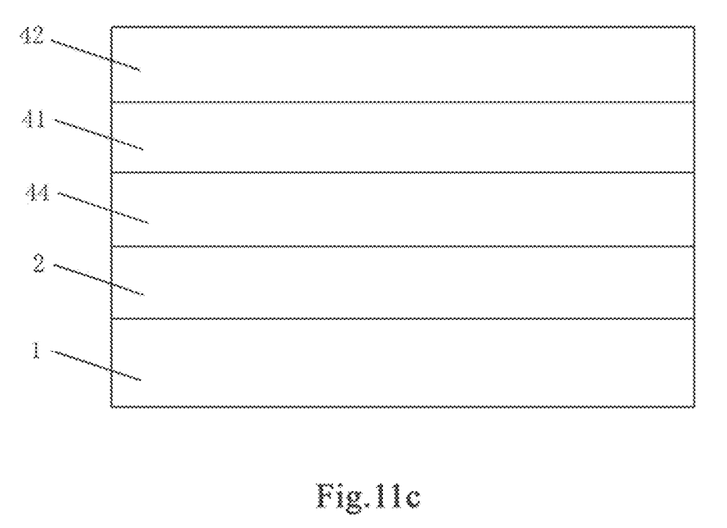
FIG. 11c is a schematic view showing formation of the hole transport layer and the quantum dot layer in the fourth embodiment.

FIG. 11c is a schematic view showing formation of the hole transport layer and the quantum dot layer in the fourth embodiment. As shown in FIG. 11c, a hole transporting material layer is spin-coated on the hole injection layer 44 by a spin coating process, and the hole transport material layer is subjected to a drying processing to form an initial hole transport layer having an initial thickness. Specifically, the hole transport material layer can be dried at a drying temperature of 180° C. in a nitrogen atmosphere for 30 minutes, while the spin-coating speed of the spin coating process is 2000 rpm and the spin-coating period of the spin coating process is 30 s. Then, a quantum dot material layer is formed on the initial hole transport layer by a spin coating process, and the quantum dot material layer causes damage to the initial hole transport layer to obtain a hole transport layer 41 having a first thickness. The material of the hole transport layer 41 may be TFB, and the solvent of the quantum dot material layer is toluene. The first thickness is in the range of 6 nm to 10 nm, preferably the first thickness is 6.4 nm. The initial thickness ranges from 20 nm to 30 nm, preferably the initial thickness is 24 nm.

Step 204, forming an electron injection transport layer on the quantum dot layer.

Figure 11D:
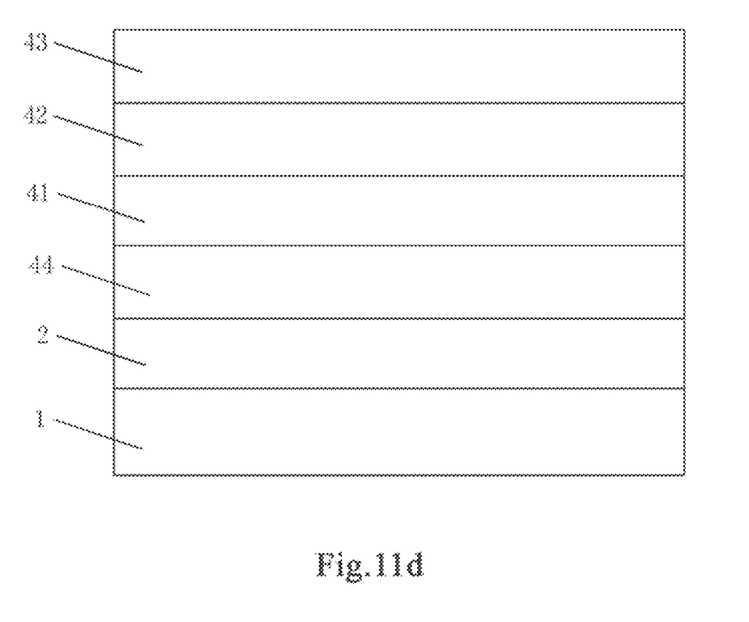
FIG. 11d is a schematic view showing formation of the electron injection transport layer in the fourth embodiment.

FIG. 11d is a schematic view showing formation of the electron injection transport layer in the fourth embodiment. As shown in FIG. 11d, an electron injection transport material layer is spin-coated on the quantum dot layer 42, and the electron injection transport material layer is subjected to a drying process to form an electron injection transport layer 43. Specifically, the electron injection transport material layer can be dried at a drying temperature of 80 T in a nitrogen atmosphere for 30 min. The material of the electron injection transport material layer may be zinc oxide.

Step 205, forming a second electrode layer on the electron injection transport layer.

As shown in FIG. 1, a second electrode layer 3 can be formed on the electron injection transport layer by an evaporation process. The material of the second electrode layer 3 may be A1.

Step 206, forming an encapsulating cover on the second electrode layer.

The encapsulating cover (not shown in the figures) can be used to protect the respective structures in the light emitting device.

The manufacturing method provided in the present embodiment can be used for fabricating the light emitting device in the first embodiment. The above-mentioned first embodiment can be referred to for a detailed description to the light emitting device.

In the solution of the manufacturing method of the light emitting device according to the present embodiment, a first electrode layer, a second electrode layer and a light emitting layer are formed on the substrate, the light emitting layer is disposed between the first electrode layer and the second electrode layer, and the light emitting layer includes a hole transport layer having a first thickness, thereby avoiding degradation of the performance of the light emitting device.

It can be understood that the foregoing implementations are merely exemplary implementations used for describing the principle of the present invention, but the present invention is not limited thereto. Those of ordinary skill in the art may make various variations and modifications without departing from the spirit and essence of the present invention, and these variations and modifications shall fall into the protection scope of the present invention.

The invention claimed is:

1. A manufacturing method of a light emitting device, comprising steps of:
    forming a first electrode layer on a substrate;
    forming a light emitting layer on the first electrode layer, the light emitting layer comprising a quantum dot layer and a hole transport layer having a first thickness capable of avoiding performance degradation of the light emitting device; and
    forming a second electrode layer on the light emitting layer,
    wherein the step of forming a light emitting layer on the first electrode layer comprises:
    coating a hole transport material layer on the first electrode layer through spin coating process;
    drying the hole transport material layer to form an initial hole transport layer having an initial thickness;
    forming a quantum dot material layer on the initial hole transport layer through spin coating process, wherein the initial hole transport layer is damaged by solvent of the quantum dot material layer so as to form the hole transport layer having the first thickness.

2. The manufacturing method according to claim 1, wherein the initial thickness ranges from 20 nm to 30 nm.

3. The manufacturing method according to claim 2, wherein the initial thickness is 24 nm.

4. The manufacturing method according to claim 1, wherein the first thickness ranges from 6 nm to 10 nm.

5. The manufacturing method according to claim 4, wherein the first thickness is 6.4 nm.

6. The manufacturing method according to claim 1, wherein a spin coating speed of the spin coating process is 2000 rpm, and a spin coating period of the spin coating process is 30 s.

7. The manufacturing method according to claim 1, wherein the step of drying the hole transport material layer comprises:
    in a nitrogen atmosphere, performing a drying process at a temperature of 180° C. on the hole transport material layer for 30 min.

8. The manufacturing method according to claim 1, wherein the light emitting layer further comprises an electron injection transport layer, the step of forming the light emitting layer further comprises:
    forming an electron injection transport layer through spin coating process after the hole transport layer is formed.

* * * * *